US009703162B2

(12) United States Patent
Zhang et al.

(10) Patent No.: US 9,703,162 B2
(45) Date of Patent: Jul. 11, 2017

(54) DISPLAY DEVICE INCLUDING AUXILIARY LINES AND POLARIZING FILMS, AND MANUFACTURING METHOD THEREOF

(71) Applicant: Boe Technology Group Co., Ltd., Beijing (CN)

(72) Inventors: Xiangyan Zhang, Beijing (CN); Yanbing Wu, Beijing (CN); Wenbo Li, Beijing (CN); Pan Li, Beijing (CN); Qian Jia, Beijing (CN)

(73) Assignee: Boe Technology Group Co., Ltd., Beijing (CN)

( * ) Notice: Subject to any disclaimer, the term of this patent is extended or adjusted under 35 U.S.C. 154(b) by 58 days.

(21) Appl. No.: 14/785,808

(22) PCT Filed: Mar. 23, 2015

(86) PCT No.: PCT/CN2015/074856
§ 371 (c)(1),
(2) Date: Oct. 20, 2015

(87) PCT Pub. No.: WO2016/078272
PCT Pub. Date: May 26, 2016

(65) Prior Publication Data
US 2016/0342057 A1 Nov. 24, 2016

(30) Foreign Application Priority Data

Nov. 17, 2014 (CN) .......................... 2014 1 0655138

(51) Int. Cl.
*G02F 1/1362* (2006.01)
*G02F 1/1335* (2006.01)
(Continued)

(52) U.S. Cl.
CPC .... *G02F 1/136286* (2013.01); *G02F 1/13439* (2013.01); *G02F 1/133345* (2013.01);
(Continued)

(58) Field of Classification Search
CPC ......... G02F 1/136227; G02F 1/133528; G02F 2001/13629; G02F 2001/133548
See application file for complete search history.

(56) References Cited

U.S. PATENT DOCUMENTS

2007/0114625 A1  5/2007  Hsiao et al.
2009/0026383 A1*  1/2009  Kim .................. H01L 27/14683
                                                     250/370.11
(Continued)

FOREIGN PATENT DOCUMENTS

CN          101752401          6/2010
CN          101807585          8/2010
(Continued)

OTHER PUBLICATIONS

International Search Report and Written Opinion from PCT/CN15/074856 dated Aug. 4, 2015.
(Continued)

*Primary Examiner* — Daniel Luke
(74) *Attorney, Agent, or Firm* — Calfee, Halter & Griswold LLP

(57) ABSTRACT

The embodiments of the present invention provide a substrate and a manufacturing method thereof, as well as a display device. The substrate comprises: a base substrate, a plurality of gate lines arranged in parallel, a first insulating layer that covers the gate lines, a plurality of data lines located on the first insulating layer and perpendicular to the gate lines, a second insulating layer that covers the data lines, and pixel electrodes of sub-pixel areas enclosed by the data lines and the gate lines; polarizing films that cover the pixel electrodes; and first auxiliary gate lines arranged on the second insulating layer and parallel to the gate lines, at least two portions on each of the first auxiliary gate lines being electrically connected with at least two corresponding portions on the gate line through via holes that penetrate the first
(Continued)

insulating layer and the second insulating layer, the first auxiliary gate lines and the polarizing films are formed by performing a same patterning process to a same layer of transparent conductive material. The embodiments of the present invention can reduce signal delay in a display device, and can be used for manufacture of a display.

15 Claims, 6 Drawing Sheets

(51) Int. Cl.
| | |
|---|---|
| H01L 23/48 | (2006.01) |
| H01L 21/768 | (2006.01) |
| H01L 21/84 | (2006.01) |
| H01L 21/82 | (2006.01) |
| H01L 23/50 | (2006.01) |
| G02F 1/1333 | (2006.01) |
| G02F 1/1343 | (2006.01) |
| H01L 27/12 | (2006.01) |

(52) U.S. Cl.
CPC .. *G02F 1/133528* (2013.01); *G02F 1/136227* (2013.01); *H01L 21/768* (2013.01); *H01L 21/82* (2013.01); *H01L 21/84* (2013.01); *H01L 23/481* (2013.01); *H01L 23/50* (2013.01); *H01L 27/124* (2013.01); *H01L 27/1259* (2013.01); *G02F 2001/13629* (2013.01); *G02F 2001/133548* (2013.01); *G02F 2001/136295* (2013.01); *G02F 2201/123* (2013.01); *H01L 2924/0002* (2013.01)

(56) References Cited

U.S. PATENT DOCUMENTS

| | | | | |
|---|---|---|---|---|
| 2009/0283768 | A1* | 11/2009 | Wang | G02F 1/133536 257/59 |
| 2010/0265447 | A1* | 10/2010 | Seo | G02F 1/134363 349/141 |
| 2012/0133855 | A1* | 5/2012 | Whangbo | G02F 1/1343 349/41 |
| 2015/0187309 | A1* | 7/2015 | Kim | G09G 3/3659 345/99 |

FOREIGN PATENT DOCUMENTS

| | | |
|---|---|---|
| CN | 102135691 | 7/2011 |
| CN | 102830534 | 12/2012 |
| CN | 103077944 | 5/2013 |
| CN | 104409455 | 3/2015 |

OTHER PUBLICATIONS

Office action from Chinese Application No. 201410655138.5 dated Nov. 7, 2016.

* cited by examiner

DISPLAY DEVICE INCLUDING AUXILIARY LINES AND POLARIZING FILMS, AND MANUFACTURING METHOD THEREOF

RELATED APPLICATIONS

The present application is the U.S. national phase entry of PCT/CN2015/074856, with an international filing date of Mar. 23, 2015, which claims the benefit of Chinese Patent Application No. 201410655138.5, filed Nov. 17, 2014, the entire disclosures of which are incorporated herein by reference.

FIELD OF THE INVENTION

The present invention relates to the field of display manufacturing, particularly to a substrate and a manufacturing method thereof, as well as a display device.

BACKGROUND OF THE INVENTION

Liquid crystal display (LCD) has the advantages of light weight, small thickness and low power consumption etc.; it has been widely used in electronic products such as television, mobile phone, display and so on. A liquid crystal display is constituted by pixel matrix in both horizontal and vertical directions. When the liquid crystal display performs display, a driving circuit outputs a driving signal to scan the respective pixel units row by row. The driving circuit of the liquid crystal display mainly comprises a gate driving circuit and a source driving circuit, the source driving circuit latches the inputted display data and clock signals in sequence at regular time, converts them into source driving signals and inputs them into the data lines of the liquid crystal panel; the gate driving circuit converts the inputted clock signal into a gate driving signal via a shift register, and applies it into the gate lines of the liquid crystal panel row by row, the respective pixel units in the pixel matrix display gray scale under the control of the gate driving circuit and the source driving circuit.

At present, the display device is developing towards the direction of larger size and smaller thickness, however, the larger the size of the display device is or the higher the resolution is, the longer the data line and the gate line are required, thereby rendering the resistance of the gate line and the data line of the display device larger. Whereas the gate driving circuit needs to input the gate driving signal into the pixel unit through the gate line, the source driving circuit also needs to input the converted source driving signal into the pixel unit through the data line, hence, the larger and larger resistance in the gate line or the data line will result in larger and larger delay of the gate driving signal or the source driving signal, thereby rendering gray scale display abnormal.

SUMMARY OF THE INVENTION

The embodiments of the present invention provide a substrate and a manufacturing method thereof, as well as a display device, for reducing resistance of the gate line or the data line, thereby reducing signal delay brought by gate line resistance or data line resistance in the display device. The embodiments of the present invention adopt the following technical solutions:

In a first aspect, a substrate is provided, comprising: a base substrate, a plurality of gate lines located on the base substrate and arranged in parallel, a first insulating layer that covers the gate lines, a plurality of data lines located on the first insulating layer and perpendicular to the gate lines, a second insulating layer that covers the data lines, and pixel electrodes located in sub-pixel areas enclosed by the data lines and the gate lines;

the substrate further comprising:

polarizing films that cover the pixel electrodes, projections of the polarizing films corresponding to the pixel electrodes; and first auxiliary gate lines arranged on the second insulating layer and parallel to the gate lines, projections of the first auxiliary gate lines corresponding to the gate lines, at least two portions on each of the first auxiliary gate lines are electrically connected with at least two corresponding portions on the gate line through via holes that penetrate the first insulating layer and the second insulating layer; wherein the first auxiliary gate lines and the polarizing films are formed by performing a same patterning process to a same layer of transparent conductive material;

or, the substrate further comprising: polarizing films that cover the pixel electrodes, projections of the polarizing films corresponding to the pixel electrode; and first auxiliary data lines arranged on the second insulating layer and parallel to the data lines, projections of the first auxiliary data lines corresponding to the data lines, at least two portions on each of the first auxiliary data lines are electrically connected with at least two corresponding portions on the data line through via holes that penetrate the second insulating layer; wherein the first auxiliary data lines and the polarizing films are formed by performing a same patterning process to a same layer of transparent conductive material.

Optionally, when the substrate comprises the polarizing films and the first auxiliary gate lines, between two adjacent data lines, a via hole that penetrates the first insulating layer and the second insulating layer is arranged between each of the gate lines and a corresponding first auxiliary gate line.

Optionally, when the substrate comprises the polarizing films and the first auxiliary data lines, between two adjacent gate lines, a via hole that penetrates the second insulating layer is arranged between each of the data lines and a corresponding first auxiliary data line.

Optionally, when the substrate comprises the polarizing films and the first auxiliary gate lines, the substrate further comprises: second auxiliary data lines;

the second auxiliary data lines being arranged on the second insulating layer, the second auxiliary data lines being parallel to the data lines, projections of the second auxiliary data lines corresponding to the data lines, the second auxiliary data lines being separated into a plurality of auxiliary data line segments by the first auxiliary gate lines, at least two portions on each of the auxiliary data line segments are electrically connected with at least two corresponding portions on the data line through a via hole that penetrates the second insulating layer; wherein the first auxiliary gate lines, the polarizing films and the second auxiliary data lines are formed by performing a same patterning process to a same layer of transparent conductive material.

Optionally, when the substrate comprises the polarizing films and the first auxiliary data lines, the substrate further comprises: second auxiliary gate lines;

the second auxiliary gate lines being arranged on the second insulating layer, the second auxiliary gate lines being parallel to the gate lines, projections of the second auxiliary gate lines corresponding to the gate lines, the second auxiliary gate lines being separated into a plurality of auxiliary gate line segments by the first auxiliary data lines, at least two portions on each of the auxiliary gate line segments are electrically connected with at least two corresponding portions on the gate line through a via hole that penetrates the first insulating layer and the second insulating layer; wherein the first auxiliary data lines, the polarizing films and the second auxiliary gate lines are formed by performing a same patterning process to a same layer of transparent conductive material.

Optionally, the transparent conductive material is a wire grid polarizing material.

In a second aspect, a display device is provided, comprising a substrate as stated in any of the above.

In a third aspect, a method for manufacturing a substrate is provided, comprising:

fabricating a plurality of gate lines arranged in parallel on a base substrate;

fabricating a first insulating layer that covers the gate lines;

fabricating a plurality of data lines located on the first insulating layer and perpendicular to the gate lines;

fabricating a second insulating layer that covers the data lines;

forming pixel electrodes in sub-pixel areas enclosed by the gate lines and the data lines; and fabricating polarizing films and first auxiliary gate lines, comprising: forming, at corresponding positions of each of the gate lines, at least two via holes that penetrate the first insulating layer and the second insulating layer with a first patterning process; forming a transparent conductive material layer that covers the pixel electrodes and the second insulating layer; performing a second patterning process to the transparent conductive material layer to form polarizing films and first auxiliary gate lines, each of the gate lines being electrically connected with a corresponding first auxiliary gate line through a via hole that penetrates the first insulating layer and the second insulating layer;

or, fabricating polarizing films and first auxiliary data lines, comprising: forming, at corresponding positions of each of the data lines, at least two via holes that penetrate the second insulating layer with a first patterning process; forming a transparent conductive material layer that covers the pixel electrodes and the second insulating layer; performing a second patterning process to the transparent conductive material layer to form polarizing films and first auxiliary data lines, each of the data lines being electrically connected with a corresponding first auxiliary data line through at least two via holes on the second insulating layer.

Optionally, when the method comprises the step of fabricating polarizing films and first auxiliary gate lines, the method further comprises:

between two adjacent gate lines, forming, at corresponding positions of each of the data lines, at least two via holes that penetrate the second insulating layer with the first patterning process;

performing the second patterning process to the transparent conductive material layer to form second auxiliary data lines, the second auxiliary data lines being separated into a plurality of auxiliary data line segments by the first auxiliary gate lines, at least two portions on each of the auxiliary data lines being electrically connected with at least two corresponding portions on the data line through via holes that penetrate the second insulating layer.

Optionally, when the method comprises the step of fabricating polarizing films and first auxiliary data lines, the method further comprises:

between two adjacent data lines, forming, at corresponding positions of each of the gate lines, at least two via holes that penetrate the first insulating layer and the second insulating layer with the first patterning process, performing the second patterning process to the transparent conductive material layer to form second auxiliary gate lines, the second auxiliary gate lines being separated into a plurality of auxiliary gate line segments by the first auxiliary data lines, at least two portions on each of the auxiliary gate line segments being electrically connected with at least two corresponding portions on the gate line through via holes that penetrate the first insulating layer and the second insulating layer.

Optionally, the transparent conductive material is a wire grid polarizing material.

In the substrate and the manufacturing method thereof, as well as the display device provided by the embodiments of the present invention, first auxiliary gate lines are arranged on the second insulating layer, and the first auxiliary gate lines and the gate lines are connected in parallel through at least two via holes that penetrate the first insulating layer and the second insulating layer, thereby reducing the resistance of the gate lines, or first auxiliary data lines are arranged on the second insulating layer, and the first auxiliary data lines and the data lines are connected in parallel through at least two via holes that penetrate the second insulating layer, thereby reducing the resistance of the data lines, consequently reducing signal delay brought by the gate line resistance or the data line resistance in the display device.

BRIEF DESCRIPTION OF THE DRAWINGS

In order to explain the technical solutions of the embodiments of the present invention more clearly, the drawings to be used in the embodiments will be introduced briefly next. Apparently, the drawings described below are only some embodiments of the present invention, for the ordinary skilled person in the art, other drawings can also be obtained from these drawings on the premise of not paying any creative work.

REFERENCE SIGNS base substrate—101; first insulating layer—102; gate line—103, data line—104; second insulating layer—105;

pixel electrode—106; polarizing film—107; first auxiliary gate line—108; via hole that penetrates the first insulating layer and the second insulating layer—109; first auxiliary data line—110; via hole that penetrates the second insulating layer—111; second auxiliary data lines—112; auxiliary data line segment—112-1; second auxiliary gate line—113; auxiliary gate line segment—113-1.

DETAILED DESCRIPTION OF THE INVENTION

Next, the substrate and the manufacturing method thereof, as well as the display device provided by the embodiments of the present invention will be described in detail with reference to the drawings, wherein the same reference sign is used to indicate the same component in the text. In the following description, large amount of details are provided for the convenience of explanation, so as to provide a comprehensive understanding to one or more embodiments. However, it is obvious that the embodiments can also be carried out not using these details. In other examples, the well known structure and device are shown in the form of block diagrams, for the convenience of describing one or more embodiments.

The expressions "upper", "lower" in the embodiments of the present invention depend on the sequence when manufacturing the substrate, for example, the upper pattern refers to a pattern formed later, the lower pattern refers to a pattern formed earlier.

Figure 1:
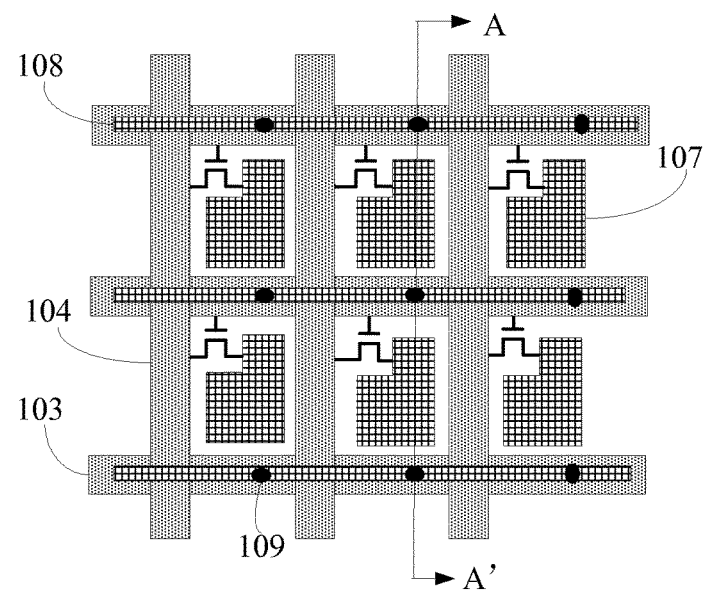
FIG. 1 is a schematic structural view of a substrate provided by the embodiment of the present invention.
Figure 2:
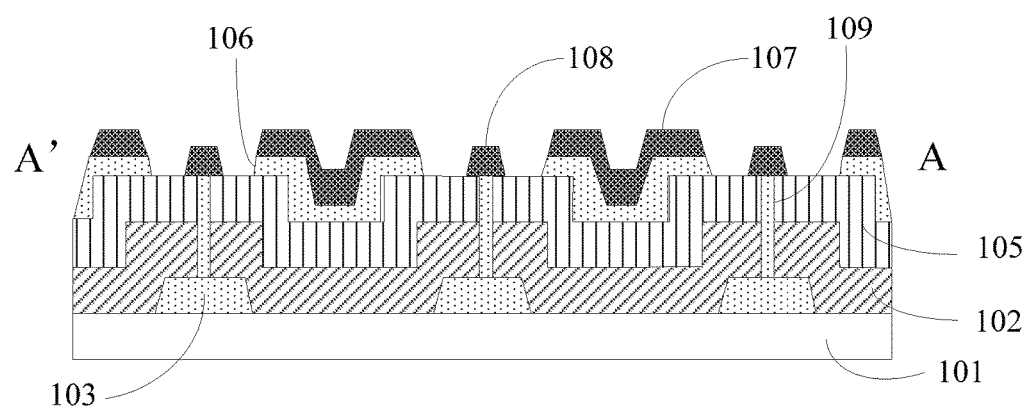
FIG. 2 is a sectional view of A-A' section of the substrate as shown in FIG. 1 provided by the embodiment of the present invention.

One embodiment of the present invention provides a substrate, as shown in FIGS. 1, 2, wherein FIG. 1 is a vertical view of the substrate, FIG. 2 is a sectional view along A-A' section of the vertical view as shown in FIG. 1; specifically the substrate comprises: a base substrate 101, a plurality of gate lines 103 located on the base substrate 101 and arranged in parallel, a first insulating layer 102 that covers the gate lines 103, a plurality of data lines 104 located on the first insulating layer 102 and perpendicular to the gate lines 103, a second insulating layer 105 that covers the data lines, and pixel electrodes 106 located in sub-pixel areas enclosed by the data lines 104 and the gate lines 103; the substrate further comprises:

polarizing films 107 that cover the pixel electrodes 106, projections of the polarizing films 107 corresponding to the pixel electrodes 106;

and, first auxiliary gate lines 108 arranged on the second insulating layer 105 and parallel to the gate lines 103, projections of the first auxiliary gate lines 108 corresponding to the gate lines 103, at least two portions on each of the first auxiliary gate lines 108 are electrically connected with at least two corresponding portions on the gate line 103 through via holes 109 that penetrate the first insulating layer 102 and the second insulating layer 105, wherein the first auxiliary gate lines 108 and the polarizing films 107 are formed by performing a same patterning process to a same layer of transparent conductive material.

The substrate provided by the embodiment of the present invention arranges first auxiliary gate lines on the second insulating layer, and connects the first auxiliary gate lines and the gate lines in parallel through via holes that penetrate the first insulating layer and the second insulating layer, thereby reducing the resistance of the gate lines, so as to reduce signal delay brought by the gate line resistance in the display device.

Optionally, the transparent conductive material is a wire grid polarizing material, for example: it may be a wire grid polarizer (WGP). When the WGP is used, the polarizing film in the embodiment of the present invention is formed by the WGP directly deposited on the pixel electrode, wherein the thickness of the polarizing film can be controlled with deposition process; whereas the polarizer of the traditional display device is formed by composition of multi-layer polymer materials, and then the polarizer is fixed on the substrate with adhesive. Compared with the prior art, since the thickness of the polarizing film can be controlled with deposition process, the embodiment of the present invention can control the module thickness of the display device more easily, thereby it is easier to reduce the module thickness of the display device; moreover, the above first auxiliary gate lines and the polarizing films are formed by performing the same patterning process to the same layer of material, compared with the manufacturing process of the polarizer in the prior art, the embodiment of the present invention does not need to add extra process flows.

Figure 3:
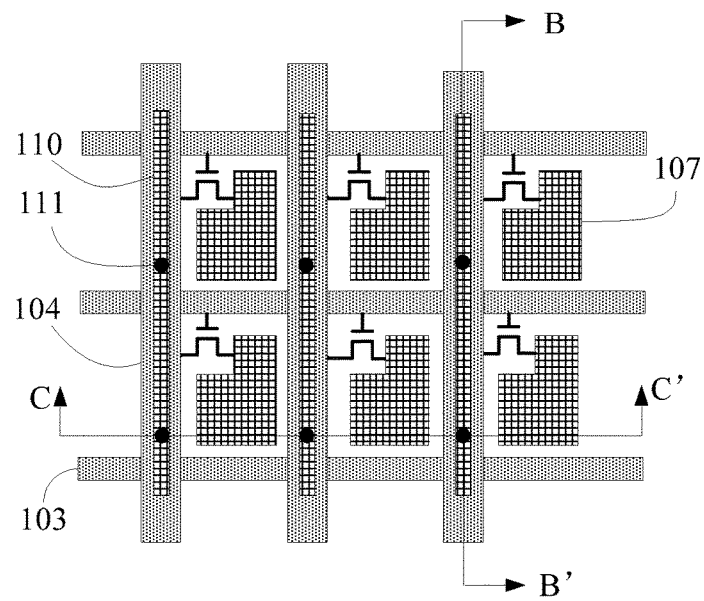
FIG. 3 is a schematic structural view of another substrate provided by the embodiment of the present invention.
Figure 4:
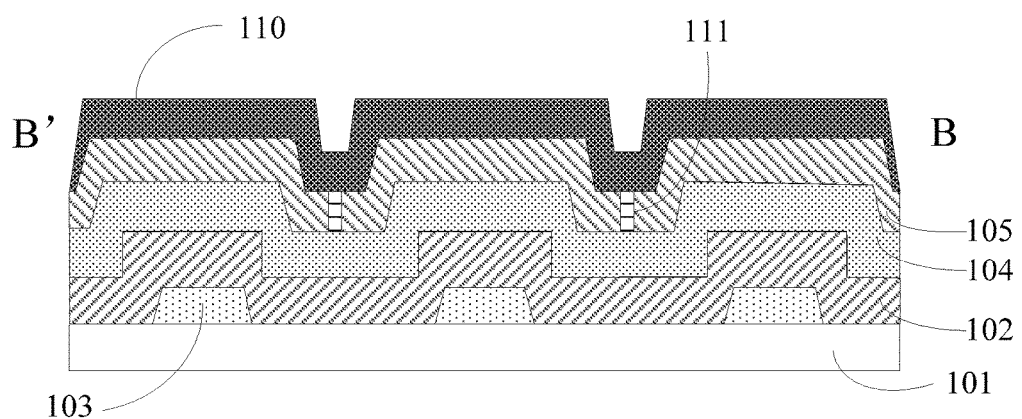
FIG. 4 is a sectional view of B-B' section of the substrate as shown in FIG. 3 provided by the embodiment of the present invention.
Figure 5:
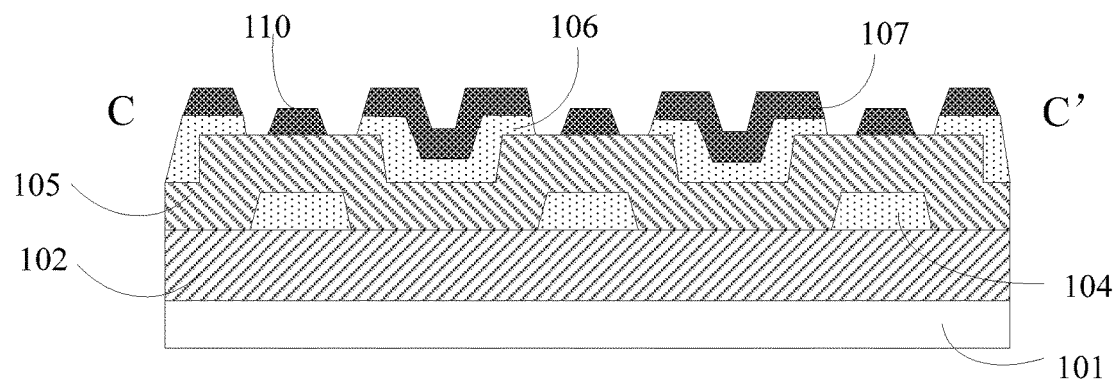
FIG. 5 is a sectional view of C-C' section of the substrate as shown in FIG. 3 provided by the embodiment of the present invention.

One embodiment of the present invention provides a substrate, as shown in FIGS. 3, 4 and 5, wherein FIG. 3 is a vertical view of the substrate, FIG. 4 is a sectional view along the B-B' section of the vertical view as shown in FIG. 3, FIG. 5 is a sectional view along the C-C' section of the vertical view as shown in FIG. 3; specifically the substrate comprises: a base substrate 101, a plurality of gate lines 103 located on the base substrate 101 and arranged in parallel, a first insulating layer 102 that covers the gate lines 103, a plurality of data lines 104 located on the first insulating layer 102 and perpendicular to the gate lines 103, a second insulating layer 105 that covers the data lines, and pixel electrodes 106 located in sub-pixel areas enclosed by the data lines 104 and the gate lines 103; the substrate further comprises:

polarizing films 107 that cover the pixel electrodes 106, projections of the polarizing films 107 corresponding to the pixel electrodes 106;

and, first auxiliary data lines 110 arranged on the second insulating layer 105 and parallel to the data lines 104, projections of the first auxiliary data lines 110 corresponding to the data lines 104, at least two portions on each of the first auxiliary data lines 110 are electrically connected with at least two corresponding portions on the data line 104 through via holes 111 that penetrate the second insulating layer 105, wherein the first auxiliary data lines and the polarizing films are formed by performing a same patterning process to a same layer of transparent conductive material.

The substrate provided by the embodiment of the present invention arranges first auxiliary data lines on the second insulating layer, and connects the first auxiliary data lines and the data lines in parallel through via holes that penetrate the second insulating layer, thereby reducing the resistance of the data lines, so as to reduce signal delay brought by the data line resistance in the display device.

Optionally, the transparent conductive material is a wire grid polarizing material, for example: it may be a WGP. When the WGP is used, the polarizing film in the embodiment of the present invention is formed by the WGP directly deposited on the pixel electrode, wherein the thickness of the polarizing film can be controlled with deposition process; whereas the polarizer of the traditional display device is formed by composition of multi-layer polymer materials, and then the polarizer is fixed on the substrate with adhesive. Compared with the prior art, since the thickness of the polarizing film can be controlled with deposition process, the embodiment of the present invention can control the module thickness of the display device more easily, thereby it is easier to reduce the module thickness of the display device; moreover, the above first auxiliary data lines and the polarizing films are formed by performing the same patterning process to the same layer of material, compared with the manufacturing process of the polarizer in the prior art, the embodiment of the present invention does not need to add extra process flows.

Optionally, as shown in FIG. 1, when the substrate comprises the polarizing films 107 and the first auxiliary gate lines 108, between two adjacent data lines 104, a via hole 109 that penetrates the first insulating layer 102 and the second insulating layer 105 is arranged between each of the gate lines 103 and a corresponding first auxiliary gate line 108.

In the above embodiment, between two adjacent data lines, a via hole that penetrates the first insulating layer and the second insulating layer is arranged between each of the gate lines and a corresponding first auxiliary gate line, such that between two adjacent data lines, each of the gate lines and a corresponding first auxiliary gate line are connected in parallel through a via hole that penetrates the first insulating layer and the second insulating layer. Since the gate driving circuit provides a gate driving signal to the gate of the switch transistor in each stage of pixel unit through the gate line, the above connection mode can enable the gate line between the signal source of the gate driving circuit and the gate of each stage of switch transistor to be connected with the first auxiliary gate line in parallel, therefore, the above embodiment can further reduce the resistance between the gate of the switch transistor in each pixel unit and the signal source of the gate driving signal, thereby reducing signal delay brought by the gate line resistance in the display device.

Optionally, as shown in FIG. 3, when the substrate comprises the polarizing films 107 and the first auxiliary data lines 110, between two adjacent gate lines 103, a via hole 111 that penetrates the second insulating layer 105 is arranged between each of the data lines 104 and a corresponding first auxiliary data line 110.

In the above embodiment, between two adjacent gate lines, a via hole that penetrates the second insulating layer is arranged between each of the data lines and a corresponding first auxiliary data line, such that between two adjacent gate lines, each of the data lines and a corresponding first auxiliary data line are connected in parallel through a via hole that penetrates the second insulating layer. Since the source driving circuit provides a source driving signal to the source of the switch transistor in each stage of pixel unit through the data line, the above connection mode can enable the data line between the signal source of the source driving circuit and the source of each stage of switch transistor to be connected with the first auxiliary data line in parallel, therefore, the above embodiment can further reduce the resistance between the source of the switch transistor in each pixel unit and the signal source of the source driving signal, thereby reducing signal delay brought by the data line resistance in the display device.

Figure 6:
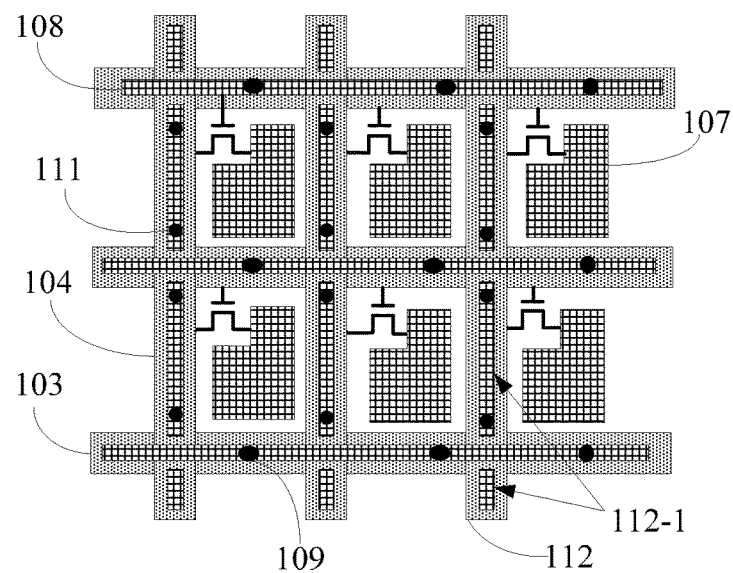
FIG. 6 is a schematic structural view of a further substrate provided by the embodiment of the present invention.

Further, as shown in FIG. 6, when the substrate comprises the first auxiliary gate lines 108 and the polarizing films 107, the substrate further comprises: second auxiliary data lines 112;

the second auxiliary data lines 112 being arranged on the second insulating layer 105, the second auxiliary data lines 112 being parallel to the data lines 104, projections of the second auxiliary data lines 112 corresponding to the data lines 104, the second auxiliary data lines 112 being separated into a plurality of auxiliary data line segments 112-1 by the first auxiliary gate lines 108, at least two portions on each of the auxiliary data line segments 112-1 are electrically connected with at least two corresponding portions on the data line through a via hole 109 that penetrates the second insulating layer; wherein the first auxiliary gate lines 108, the polarizing films 107 and the second auxiliary data lines 112 are formed by performing a same patterning process to a same layer of transparent conductive material.

In the above embodiment, the first auxiliary gate lines and the second auxiliary data lines are formed by performing a same patterning process to the same layer of transparent conductive material, the first auxiliary gate lines separate the second auxiliary data lines into a plurality of auxiliary data line segments, and at least two portions on each of the auxiliary data line segments are electrically connected with at least two corresponding portions on the data line through a via hole that penetrates the second insulating layer, such that each auxiliary data line segment is connected with a corresponding data line in parallel, thereby reducing the resistance of the data line, so as to reduce signal delay brought by data line resistance in the display device; further, only the part of the above auxiliary data line segment between two via holes can be connected with the corresponding data line in parallel, so one preferred manner is that there is a via hole at each of the two ends of the auxiliary data line segment, the auxiliary data line segment is connected with the corresponding data line in parallel through the via holes at the two ends, thus the resistance of the data line can be reduced to the utmost extent, thereby reducing the signal delay brought by the data line resistance in the display device to the utmost extent. In addition, the first auxiliary gate lines separate the second auxiliary data lines into a plurality of data line segments, which avoids electrical connection of the gate lines and the data lines caused by electrical connection of the first auxiliary gate lines and the second auxiliary data lines, thereby ensuring normal operation of the display comprising the above substrate.

Figure 7:
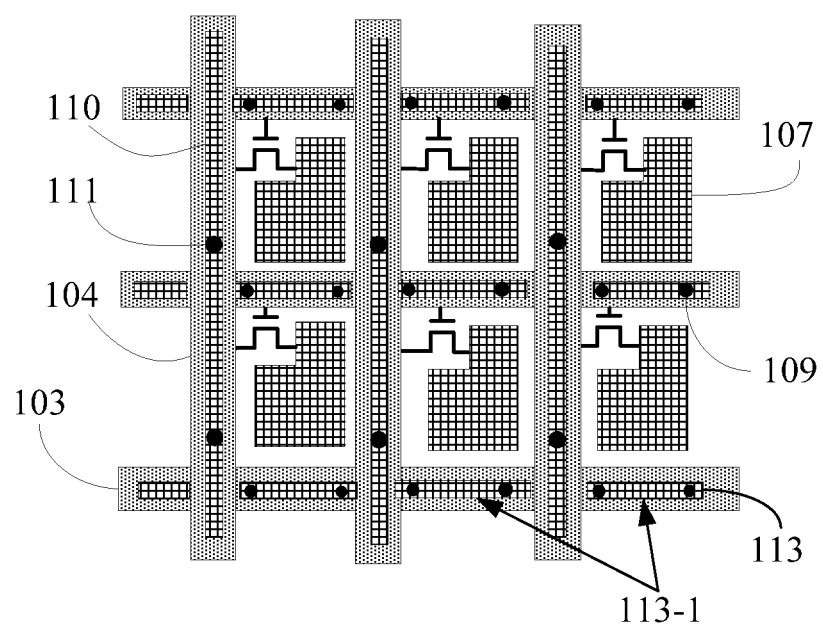
FIG. 7 is a schematic structural view of yet another substrate provided by the embodiment of the present invention.

Further, as shown in FIG. 7, when the substrate comprises the first auxiliary data lines 110 and the polarizing films 107, the substrate further comprises: second auxiliary gate lines 113;

the second auxiliary gate lines 113 being arranged on the second insulating layer 105, the second auxiliary gate lines 113 being parallel to the gate lines 103, projections of the second auxiliary gate lines 113 corresponding to the gate lines 103, the second auxiliary gate lines 113 being separated into a plurality of auxiliary gate line segments 113-1 by the first auxiliary data lines, at least two portions on each of the auxiliary gate line segments 113-1 are electrically connected with at least two corresponding portions on the gate line 103 through a via hole 109 that penetrates the first insulating layer and the second insulating layer; wherein the first auxiliary data lines 110, the polarizing films 107 and the second auxiliary gate lines 113 are formed by performing a same patterning process to a same layer of transparent conductive material.

In the above embodiment, the first auxiliary data lines and the second auxiliary gate lines are formed by performing a same patterning process to the same layer of transparent conductive material, the first auxiliary data lines separate the second auxiliary gate lines into a plurality of auxiliary gate line segments, and at least two portions on each of the auxiliary gate line segments are electrically connected with at least two corresponding portions on the gate line through a via hole that penetrates the first insulating layer and the second insulating layer, such that each auxiliary gate line segment is connected with a corresponding gate line in parallel, thereby reducing the resistance of the gate line, so as to reduce signal delay brought by gate line resistance in the display device; further, only the part of the above auxiliary gate line segment between two via holes can be connected with the corresponding gate line in parallel, so a preferred manner is that there is a via hole at each of the two ends of the auxiliary gate line segment, the auxiliary gate line segment is connected with the corresponding gate line in parallel through the via holes at the two ends, thus the resistance of the gate line can be reduced to the utmost extent, thereby reducing the signal delay brought by the gate line resistance in the display device to the utmost extent. In addition, the first auxiliary data lines separate the second auxiliary gate lines into a plurality of gate line segments, which avoids electrical connection of the gate lines and the data lines caused by electrical connection of the first auxiliary data lines and the second auxiliary gate lines, thereby ensuring normal operation of the display comprising the above substrate.

Figure 8:
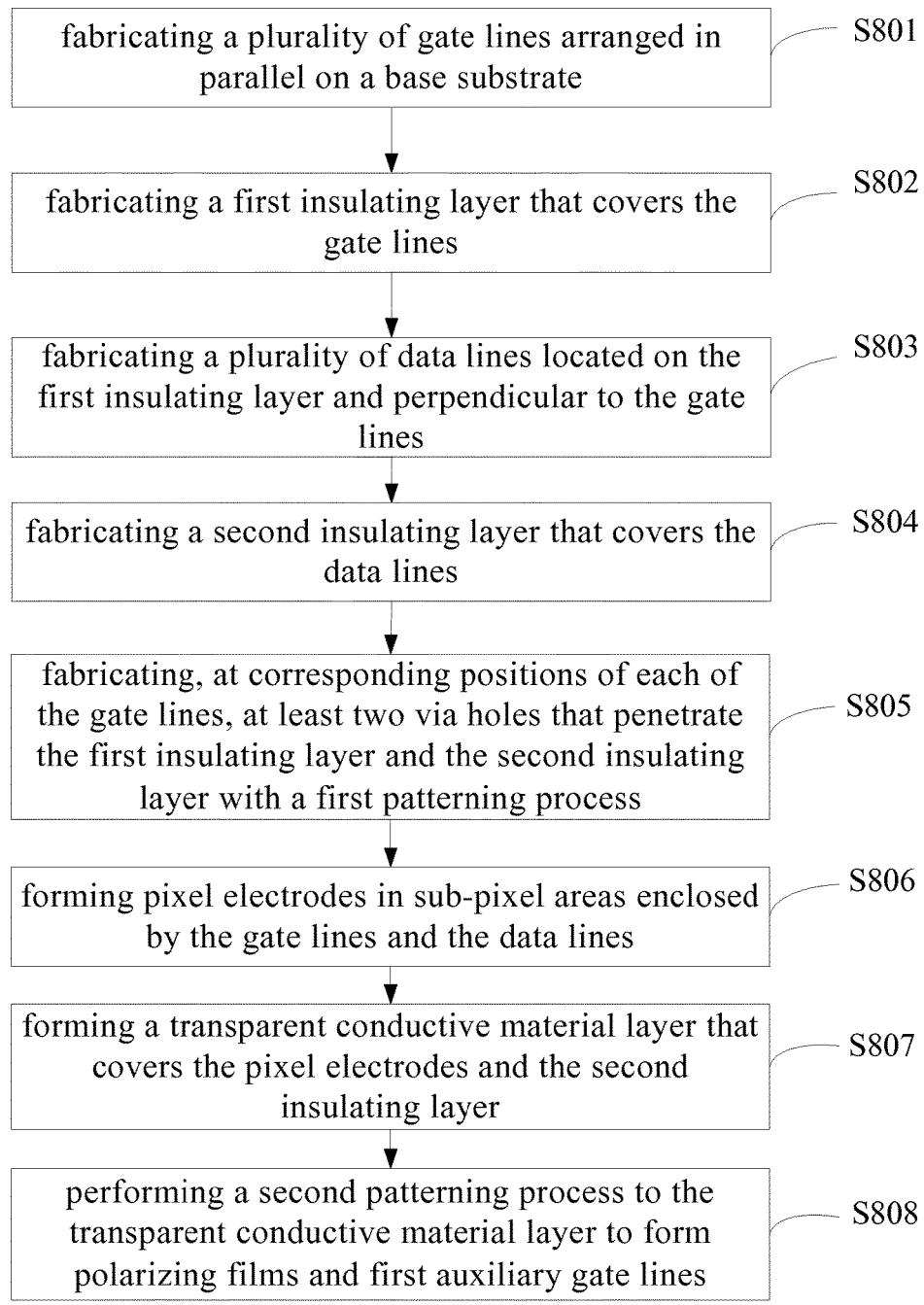
FIG. 8 is a flow chart of a manufacturing method of a substrate provided by the embodiment of the present invention.

The embodiment of the present invention provides a manufacturing method for the substrate, for manufacturing a substrate as shown in FIG. 1, 2, as shown in FIG. 8, the manufacturing method for the substrate comprises the steps of:

S801, fabricating a plurality of gate lines arranged in parallel on a base substrate.

S802, fabricating a first insulating layer that covers the gate lines.

S803, fabricating a plurality of data lines located on the first insulating layer and perpendicular to the gate lines.

S804, fabricating a second insulating layer that covers the data lines.

The manners of fabricating gate lines in the above step S801, fabricating the first insulating layer in step S802, fabricating data lines in step S803 and fabricating the second insulating layer in S804 are same as the manners of fabricating the gate lines, the insulating layer, the data lines and the second insulating layer in the prior art, which will not be defined in this text. Wherein the above first insulating layer and the second insulating layer are both separate layers. The meaning of "layer" may refer to a layer of thin film fabricated by processes such as deposition using a certain material on the substrate; for example, the above first insulating layer can be fabricated by depositing SiNx (silicon nitride) on the base substrate. Specifically, the above insulating layers can be fabricated by depositing SiNx on the base substrate firstly based on actual needs to fabricate an insulating thin film, and then removing part on the insulating thin film with a patterning process.

S805, fabricating, at corresponding positions of each of the gate lines, at least two via holes that penetrate the first insulating layer and the second insulating layer with a first patterning process.

In the above step S805, in addition to forming via holes that penetrate the first insulating layer and the second insulating layer with the first patterning process, via holes that connect the pixel electrodes and the drains of transistors in the pixel units should also be formed on the second insulating layer with the first patterning process.

S806, forming pixel electrodes in sub-pixel areas enclosed by the gate lines and the data lines.

S807, forming a transparent conductive material layer that covers the pixel electrodes and the second insulating layer.

S808, performing a second patterning process to the transparent conductive material layer to form polarizing films and first auxiliary gate lines, each of the gate lines being electrically connected with a corresponding first auxiliary gate line through a via hole that penetrates the first insulating layer and the second insulating layer.

It should be noted that in the above steps, the specific shapes and circuit connection of respective layers may refer to the corresponding device embodiments of FIGS. 1, 2. In addition, the patterning processes used in the manufacturing method for the substrate generally include processes such as cleaning, filming, photoresist coating, exposing, developing, etching, photoresist stripping etc.; the metal layer is generally filmed using physical vapor deposition (e.g.: magnetron sputtering method), and a pattern is formed with wet etching, whereas the non-metal layer is generally filmed using chemical vapor deposition, and a pattern is formed with dry etching. Indeed, in step S808, in addition to the above patterning processes, the polarizing films and the first auxiliary gate lines can also be formed with patterning processes such as nano imprinting, optical diffraction dry etching, electron beam direct writing etc., which will not be defined in this text.

The manufacturing method for the substrate provided by the embodiment of the present invention, by arranging first auxiliary gate lines on the second insulating layer, and connecting the first auxiliary gate lines with the gate lines in parallel through at least two via holes that penetrate the first insulating layer and the second insulating layer, reduces the resistance of the gate lines, thereby reducing signal delay brought by the gate line resistance in the display device.

Optically, the above transparent conductive material is a wire grid polarizing material, for example: it may be a WGP. When the WGP is used, the polarizing film in the embodiment of the present invention is formed by the WGP directly deposited on the pixel electrode, wherein the thickness of the polarizing film can be controlled with deposition process; whereas the polarizer of the traditional display device is formed by composition of multi-layer polymer materials, and then the polarizer is fixed on the substrate with adhesive. Compared with the prior art, since the thickness of the polarizing film can be controlled with deposition process, the embodiment of the present invention can control the module thickness of the display device more easily, thereby it is easier to reduce the module thickness of the display device; moreover, the above first auxiliary data lines and the polarizing films are formed by performing the same patterning process to the same layer of material, compared with the manufacturing process of the polarizer in the prior art, the embodiment of the present invention does not need to add extra process flows.

Optionally, the manufacturing method for the substrate in the corresponding embodiment of FIG. 8 further comprises:

In step S805, further comprising: between two adjacent gate lines, forming, at corresponding positions of each of the data lines, at least two via holes that penetrate the second insulating layer with the first patterning process.

In step S808, further comprising: performing the second patterning process to the transparent conductive material layer to form second auxiliary data lines, the second auxiliary data lines being separated into a plurality of auxiliary data line segments by the first auxiliary gate lines, at least two portions on each of the auxiliary data lines being electrically connected with at least two corresponding portions on the data line through via holes that penetrate the second insulating layer.

In the above embodiment, the second auxiliary data lines formed in the step S808 are electrically connected with the data lines through the via holes that penetrate the second insulating layer formed in step S805, such that each of the second auxiliary data line segments is connected in parallel with the corresponding data line, thereby reducing the resistance of the data line, so as to reduce the signal delay brought by the data line resistance in the display device.

Figure 9:
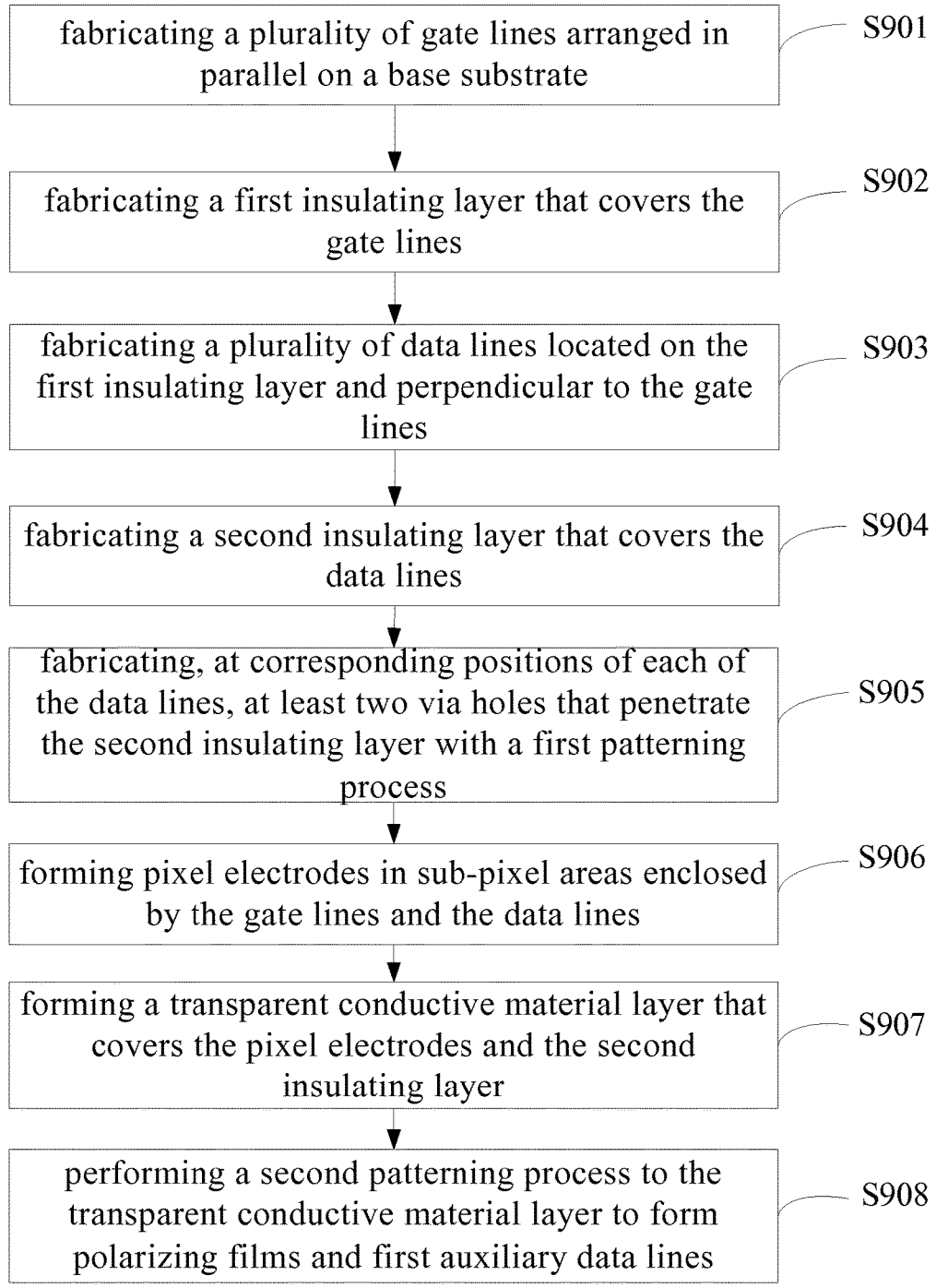
FIG. 9 is a flow chart of another manufacturing method of a substrate provided by the embodiment of the present invention.

One embodiment of the present invention provides a manufacturing method for the substrate, for manufacturing a substrate as shown in FIGS. 3, 4 and 5, as shown in FIG. 9, the manufacturing method for the substrate comprises the steps of:

S901, fabricating a plurality of gate lines arranged in parallel on a base substrate.

S902, fabricating a first insulating layer that covers the gate lines.

S903, fabricating a plurality of data lines located on the first insulating layer and perpendicular to the gate lines.

S904, fabricating a second insulating layer that covers the data lines.

The manners of fabricating gate lines in the above step S901, fabricating the first insulating layer in step S902, fabricating data lines in step S903 and fabricating the second insulating layer in S904 are same as the manners of fabricating the gate lines, the insulating layer, the data lines and the second insulating layer in the prior art, which will not be defined in this text; wherein the above first insulating layer and the second insulating layer are both separate layers. The meaning of "layer" may refer to a layer of thin film fabricated by processes such as deposition using a certain material on the substrate; for example, the above first insulating layer can be fabricated by depositing SiNx (silicon nitride) on the base substrate. Specifically again, the above insulating layers can be fabricated by depositing SiNx on the base substrate firstly based on actual needs to fabricate an insulating thin film, and then removing part on the insulating thin film with a patterning process.

S905, fabricating, at corresponding positions of each of the data lines, at least two via holes on the corresponding second insulating layer with a first patterning process.

In the above step S905, in addition to forming, at corresponding positions of each of the data lines, at least two via holes on the corresponding second insulating layer with the first patterning process, via holes that connect the pixel electrodes and the drains of transistors in the pixel units should also be formed on the second insulating layer with the first patterning process.

S906, forming pixel electrodes in sub-pixel areas enclosed by the gate lines and the data lines.

S907, forming a transparent conductive material layer that covers the pixel electrodes and the second insulating layer.

S908, performing a second patterning process to the transparent conductive material layer to form polarizing films and first auxiliary data lines, each of the data lines being electrically connected with a corresponding first auxiliary data line through at least two via holes on the second insulating layer.

It should be noted that in the above steps, the specific shapes and circuit connection of respective layers may refer to the corresponding device embodiments of FIGS. 3, 4 and 5. In addition, the patterning processes used in the manufacturing method for the substrate generally include processes such as cleaning, filming, photoresist coating, exposing, developing, etching, photoresist stripping etc.; the metal layer is generally filmed using physical vapor deposition (e.g.: magnetron sputtering method), and a pattern is formed with wet etching, whereas the non-metal layer is generally filmed using chemical vapor deposition, and a pattern is formed with dry etching. Indeed, in step S908, in addition to the above patterning processes, the polarizing films and the first auxiliary data lines can also be formed with patterning processes such as nano imprinting, optical diffraction dry etching, electron beam direct writing etc., which will not be defined in this text.

The manufacturing method for the substrate provided by the embodiment of the present invention, by arranging first auxiliary data lines on the second insulating layer, and connecting the first auxiliary data lines with the data lines in parallel through at least two via holes that penetrate the second insulating layer, reduces the resistance of the data lines, thereby reducing signal delay brought by the data line resistance in the display device.

Optically, the above transparent conductive material is a wire grid polarizing material, for example: it may be a WGP. When the WGP is used, the polarizing film in the embodiment of the present invention is formed by the WGP directly deposited on the pixel electrode, wherein the thickness of the polarizing film can be controlled with deposition process; whereas the polarizer of the traditional display device is formed by composition of multi-layer polymer materials, and then the polarizer is fixed on the substrate with adhesive. Compared with the prior art, since the thickness of the polarizing film can be controlled with deposition process, the embodiment of the present invention can control the module thickness of the display device more easily, thereby it is easier to reduce the module thickness of the display device; moreover, the above first auxiliary data lines and the polarizing films are formed by performing the same patterning process to the same layer of material, compared with the manufacturing process of the polarizer in the prior art, the embodiment of the present invention does not need to add extra process flows.

Optionally, the manufacturing method for the substrate in the corresponding embodiment of FIG. 9 further comprises:

In step S905, further comprising: between two adjacent data lines, forming, at corresponding positions of each of the gate lines, at least two via holes that penetrate the first insulating layer and the second insulating layer with the first patterning process.

In step S908, further comprising: performing the second patterning process to the transparent conductive material layer to form second auxiliary gate lines, the second auxiliary gate lines being separated into a plurality of auxiliary gate line segments by the first auxiliary data lines, at least two portions on each of the auxiliary gate lines being electrically connected with at least two corresponding portions on the gate line through via holes that penetrate the first insulating layer and the second insulating layer.

In the above embodiment, the second auxiliary gate lines formed in the step S908 are electrically connected with the gate lines through the via holes that penetrate the first insulating layer and the second insulating layer formed in step S905, thereby reducing the resistance of the gate line, so as to reduce the signal delay brought by the gate line resistance in the display device.

The embodiment of the present invention further provides a display device, comprising: any substrate provided by the embodiments of the present invention, the substrate can be obtained by the manufacturing method provided by the embodiment of the present invention. The display device may be any product or component with the display function such as a liquid crystal display, a liquid crystal television, a digital camera, a mobile phone, a tablet computer, etc.

What are stated above are only specific implementing modes of the present invention, however, the protection scope of the present invention is not limited to this, any variations or replacements that can be easily conceived by the skilled person familiar with the technical field within the technical scope disclosed by the present invention should be covered within the protection scope of the present invention. Therefore, the protection scope of the present invention should depend on the protection scopes of the claims.

The invention claimed is:

1. A substrate comprising: a base substrate, a plurality of gate lines located on the base substrate and arranged in parallel, a first insulating layer that covers the gate lines, a plurality of data lines located on the first insulating layer and perpendicular to the gate lines, a second insulating layer that covers the data lines, and pixel electrodes located in sub-pixel areas enclosed by the data lines and the gate lines;

wherein the substrate further comprises: polarizing films that cover the pixel electrodes, projections of the polarizing films corresponding to the pixel electrodes; and first auxiliary gate lines arranged on the second insulating layer and parallel to the gate lines, projections of the first auxiliary gate lines corresponding to the gate lines, at least two portions on each of the first auxiliary gate lines are electrically connected with at least two corresponding portions on a corresponding gate line through at least two via holes that penetrate the first insulating layer and the second insulating layer; wherein the first auxiliary gate lines and the polarizing films are formed by performing a same patterning process to a same layer of transparent conductive material;

or, the substrate further comprises: polarizing films that cover the pixel electrodes, projections of the polarizing films corresponding to the pixel electrode; and first auxiliary data lines arranged on the second insulating layer and parallel to the data lines, projections of the first auxiliary data lines corresponding to the data lines, at least two portions on each of the first auxiliary data lines are electrically connected with at least two corresponding portions on a corresponding data line through at least two via holes that penetrate the second insulating layer; wherein the first auxiliary data lines and the polarizing films are formed by performing a same patterning process to a same layer of transparent conductive material.

2. The substrate according to claim 1, wherein when the substrate comprises the polarizing films and the first auxiliary gate lines, between two adjacent data lines, a via hole that penetrates the first insulating layer and the second insulating layer is arranged between each of the gate lines and a corresponding first auxiliary gate line.

3. The substrate according to claim 1, wherein when the substrate comprises the polarizing films and the first auxiliary data lines, between two adjacent gate lines, a via hole that penetrates the second insulating layer is arranged between each of the data lines and a corresponding first auxiliary data line.

4. The substrate according to claim 1, wherein when the substrate comprises the polarizing films and the first auxiliary gate lines, the substrate further comprises: second auxiliary data lines;

the second auxiliary data lines being arranged on the second insulating layer, the second auxiliary data lines being parallel to the data lines, projections of the second auxiliary data lines corresponding to the data lines, the second auxiliary data lines being separated into a plurality of auxiliary data line segments by the first auxiliary gate lines, at least two portions on each of the auxiliary data line segments are electrically connected with at least two corresponding portions on the data line through at least two via holes that penetrate the second insulating layer; wherein the first auxiliary gate lines, the polarizing films and the second auxiliary data lines are formed by performing the same patterning process to the same layer of transparent conductive material.

5. The substrate according to claim 1, wherein when the substrate comprises the polarizing films and the first auxiliary data lines, the substrate further comprises: second auxiliary gate lines;

the second auxiliary gate lines being arranged on the second insulating layer, the second auxiliary gate lines being parallel to the gate lines, projections of the second auxiliary gate lines corresponding to the gate lines, the second auxiliary gate lines being separated into a plurality of auxiliary gate line segments by the first auxiliary data lines, at least two portions on each of the auxiliary gate line segments are electrically connected with at least two corresponding portions on the gate line through at least two via holes that penetrate the first insulating layer and the second insulating layer; wherein the first auxiliary data lines, the polarizing films and the second auxiliary gate lines are formed by performing the same patterning process to the same layer of transparent conductive material.

6. The substrate according to claim 1, wherein the transparent conductive material is a wire grid polarizing material.

7. The substrate according to claim 2, wherein the transparent conductive material is a wire grid polarizing material.

8. The substrate according to claim 3, wherein the transparent conductive material is a wire grid polarizing material.

9. The substrate according to claim 4, wherein the transparent conductive material is a wire grid polarizing material.

10. The substrate according to claim 5, wherein the transparent conductive material is a wire grid polarizing material.

11. A display device, comprising a substrate as claimed in claim 1.

12. A method for manufacturing a substrate, wherein the method comprises:

fabricating a plurality of gate lines arranged in parallel on a base substrate;

fabricating a first insulating layer that covers the gate lines;

fabricating a plurality of data lines located on the first insulating layer and perpendicular to the gate lines;

fabricating a second insulating layer that covers the data lines;

forming pixel electrodes in sub-pixel areas enclosed by the gate lines and the data lines; and fabricating polarizing films and first auxiliary gate lines, comprising:

forming, at corresponding positions of each of the gate lines, at least two via holes that penetrate the first insulating layer and the second insulating layer with a first patterning process; forming a transparent conductive material layer that covers the pixel electrodes and the second insulating layer;

performing a second patterning process to the transparent conductive material layer to form polarizing films and first auxiliary gate lines, each of the gate lines being electrically connected with a corresponding first auxiliary gate line through the at least two via holes that penetrate the first insulating layer and the second insulating layer;

or, fabricating polarizing films and first auxiliary data lines, comprising:
forming, at corresponding positions of each of the data lines, at least two via holes that penetrate the second insulating layer with a first patterning process; forming a transparent conductive material layer that covers the pixel electrodes and the second insulating layer; performing a second patterning process to the transparent conductive material layer to form polarizing films and first auxiliary data lines, each of the data lines being electrically connected with a corresponding first auxiliary data line through the at least two via holes that penetrate the second insulating layer.

13. The method according to claim 12, wherein when the method comprises the step of fabricating polarizing films and first auxiliary gate lines, the method further comprises:
between two adjacent gate lines, forming, at corresponding positions of each of the data lines, at least two via holes that penetrate the second insulating layer with the first patterning process;
performing the second patterning process to the transparent conductive material layer to form second auxiliary data lines, the second auxiliary data lines being separated into a plurality of auxiliary data line segments by the first auxiliary gate lines, at least two portions on each of the auxiliary data lines being electrically connected with at least two corresponding portions on the data line through the at least two via holes that penetrate the second insulating layer.

14. The method according to claim 12, wherein when the method comprises the step of fabricating polarizing films and first auxiliary data lines, the method further comprises:
between two adjacent data lines, forming, at corresponding positions of each of the gate lines, at least two via holes that penetrate the first insulating layer and the second insulating layer with the first patterning process, performing the second patterning process to the transparent conductive material layer to form second auxiliary gate lines, the second auxiliary gate lines being separated into a plurality of auxiliary gate line segments by the first auxiliary data lines, at least two portions on each of the auxiliary gate line segments being electrically connected with at least two corresponding portions on the gate line through the at least two via holes that penetrate the first insulating layer and the second insulating layer.

15. The method according to claim 12, wherein the transparent conductive material is a wire grid polarizing material.

* * * * *